United States Patent [19]
Choi

[11] Patent Number: 5,929,657
[45] Date of Patent: Jul. 27, 1999

[54] CIRCUIT FOR CONTROLLING SENSE AMPLIFIERS

[75] Inventor: Young Jung Choi, Chungcheongbuk-Do, Rep. of Korea

[73] Assignee: Hyundai Electronics Industries Co.,, Kyungki-do, Rep. of Korea

[21] Appl. No.: 08/884,373

[22] Filed: Jun. 27, 1997

[30] Foreign Application Priority Data

Jun. 29, 1996 [KR] Rep. of Korea ..................... 96-25557

[51] Int. Cl.$^6$ ..................................................... G11C 7/06
[52] U.S. Cl. ....................................... 327/51; 365/185.18
[58] Field of Search ................................. 327/51–57, 198; 365/185.18, 185.21

[56] References Cited

U.S. PATENT DOCUMENTS

| | | | |
|---|---|---|---|
| 5,619,466 | 4/1997 | McClure | 365/207 |
| 5,646,891 | 7/1997 | Okamoto | 365/185.22 |
| 5,757,703 | 5/1998 | Merritt et al. | 365/189.05 |

FOREIGN PATENT DOCUMENTS 8-96578  4/1996  Japan ........................... G11C 11/409

Primary Examiner—Toan Tran
Attorney, Agent, or Firm—Scott C. Harris Esq.

[57] ABSTRACT

The circuit for controlling a sense amplifier according to the present invention can operate plurality of sense amplifiers groups selectively by controlling a bi-directional address signal for transferring data to the output buffer, an output buffer control signal for controlling the type of the data to be outputted into 8 byte, 16 byte etc., a sense amplifier enable signal for enabling the sense amplifier, and an erasure enable signal, therefore, the present invention can minimize a number of the sense amplifier groups, thereby reducing the power consumption and implementing a low power device.

11 Claims, 2 Drawing Sheets

CIRCUIT FOR CONTROLLING SENSE AMPLIFIERS

BACKGROUND OF THE INVENTION

1. Field of the Invention

The present invention is related to a circuit for controlling sense amplifiers and, more particularly, to a circuit for controlling sense amplifiers which can operate a plurality of sense amplifier groups selectively.

2. Description of the Prior Arts

Generally, a sense amplifier in a semiconductor memory device is connected between a power supply voltage terminal Vcc and a ground voltage terminal Vss as shown in FIG. 1. And, a signal input terminal SENREF is connected to a bit line of a reference memory cell, and a signal input terminal SENDT is connected to a bit line of a selected memory cell.

When the sense amplifier enable signal is inputted through a signal input terminal SEb, the sense amplifier as described above compares the amount of current flowing through the bit line of the selected memory cell with the amount of current flowing through the bit line of the reference memory cell, and transfers the results to a data output buffer shown in FIG. 3 through an output terminal SAOUT.

Although, the sense amplifier plays a major role in reading data, the sense amplifier needs large amount of the power which occupies most of an entire power consumption of the device.

Meanwhile, the user can control freely the type of the data to be outputted such as 8 byte (x8), 16 byte (x16) etc. in the memory. Therefore, if a type of the data to be outputted is controlled to be 16 byte, it requires operation of sixteen (16) sense amplifiers and sixteen (16) data output buffers, if the type of the data to be outputted is controlled to be 8 byte, it requires operation of eight (8) sense amplifiers and eight (8) data output buffers. However, when the type of the data to be outputted is controlled to be 8 byte, eight (8) output buffers are only selected to operate, the 16 sense amplifiers are operated, thus unnecessary power are consumed. Moreover, as the memory device becomes higher integrated, an extremely small amount of current is flowed through the bit line of the memory cell, therefore, several stages of sense amplifiers must be constructed and a power consumption is more increased.

SUMMARY OF THE INVENTION

It is therefore an object of the present invention to provide a circuit for controlling sense amplifiers which can control a plurality of sense amplifier groups selectively to solve the above problems.

To achieve this object, the circuit for controlling sense amplifiers according to the present invention comprises a first inverter to which an erasure enable signal is inputted; a second inverter to which a bi-directional address signal is inputted; a third inverter to which a sense amplifier enable signal is inputted; a first NOR gate to which an output signal of the second inverter and an output buffer control signal are inputted; a first NAND gate to which an output signal of the first NOR gate and an output signal of the third inverter are inputted; a third NAND gate which inputs an output signal of the first NAND gate and an output signal of the first inverter; a fourth inverter for inverting an output signal of the third NAND gate; a first output terminal for transferring an output signal of the fourth inverter to a first sense amplifier group; a second NOR gate to which the bi-directional address signal and the output buffer control signal are inputted; a second NAND gate to which an output signal of the second NOR gate and an output signal of the third inverter are inputted; a fourth NAND gate to which an output signal of the second NAND gate and an output signal of the first inverter are inputted; a fifth inverter for inverting an output signal of the fourth NAND gate; a second output terminal for transferring an output signal of the fifth inverter to a second sense amplifier group.

BRIEF DESCRIPTION OF THE DRAWINGS

Other objects and advantages of the present invention will be understood by reading the detailed explanation of the embodiment with reference to the accompanying drawings in which.

DESCRIPTION OF THE INVENTION

Figure 1:
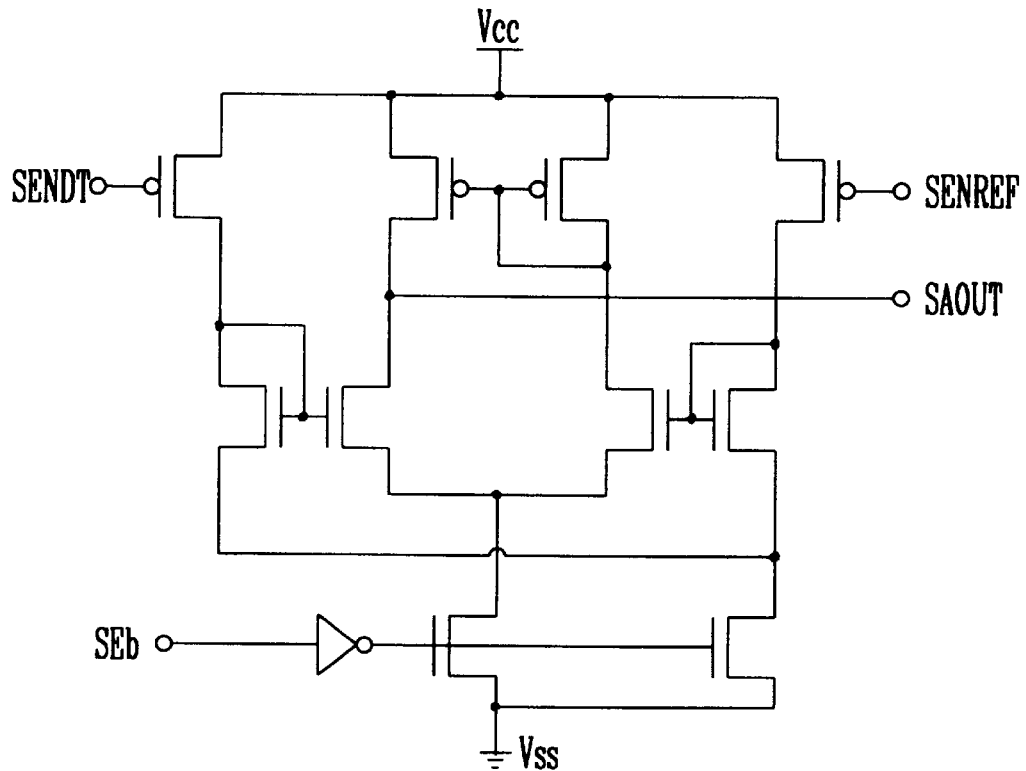
FIG. 1 is a circuit diagram of a conventional sense amplifier.
Figure 2:
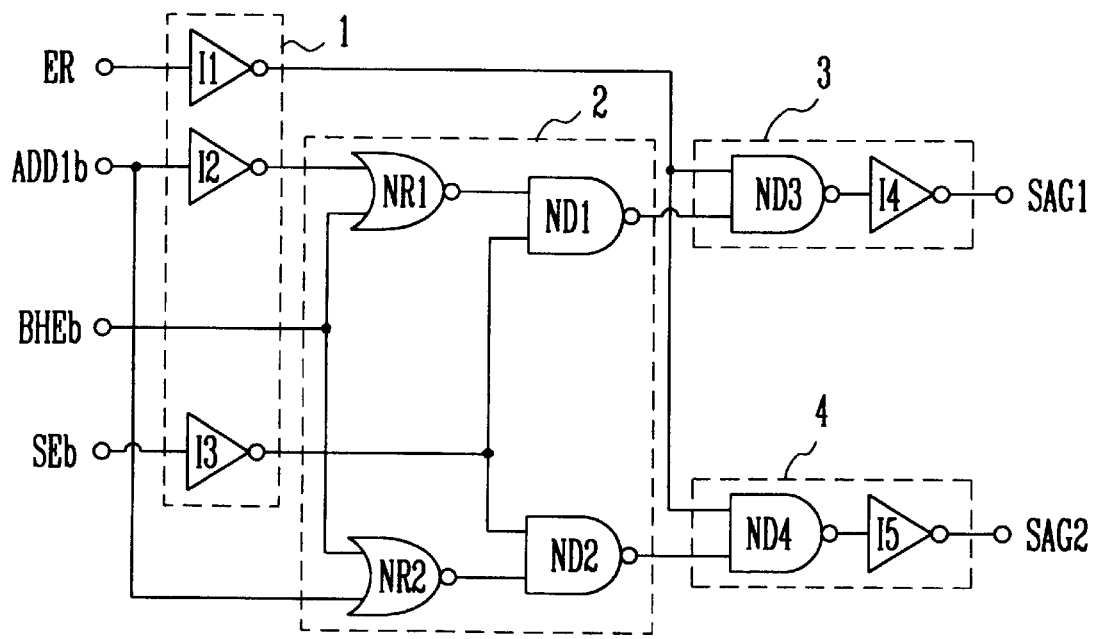
FIG. 2 is a circuit diagram of a circuit for controlling sense amplifiers according to the present invention.
Figure 3:
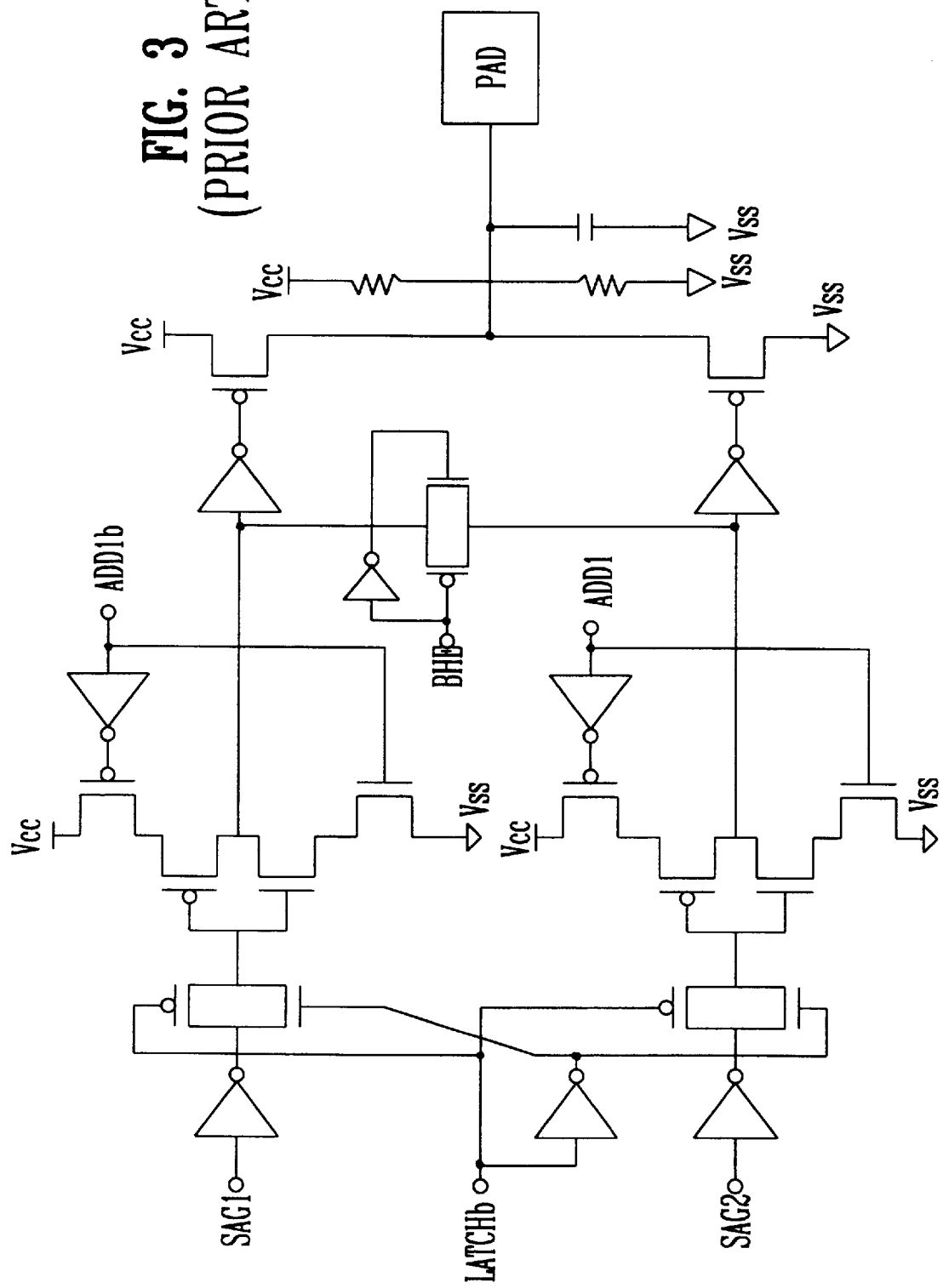
FIG. 3 is a circuit diagram of a conventional data output buffer.

FIG. 2 is a circuit diagram of a circuit for controlling sense amplifiers according to the present invention.

The circuit for controlling sense amplifiers is composed of an input means 1, a decoding means 2, a first output means 3 and a second output means 4. The input means 1 has a first inverter I1, a second inverter I2 and a third invert I3, and receives an erase enable signal ER, a bi-directional address signal ADD1b, and a sense amplifier enable signal Seb, respectively. The decoding means 2 has a first NOR gate NR1, a second NOR gate NR2, a first NAND gate ND1 and a second NAND gate ND2, and receives an output buffer control signal BHEb, the bi-directional address signal ADD1b and a first and a second output signals of the input means 1. The first output means 3 has a third NAND gate ND3 and a fourth inverter I4, and receives a third output signal of the input means 1 and a first output signal of the decoding means 2. The second output means 4 has a fourth NAND gate ND4 and a fifth inverter I5, and receives the third output signal of the input means 1 and a second output signal of the decoding means 2. An output terminal of the first output means 3 is connected to a first output terminal SAG1 and an output terminal of the second output means 4 is connected to a second output terminal SAG2. The first and second output terminals SAG1 and SAG2 are connected to a first and a second sense amplifier groups, respectively.

Referring to FIG. 2, an erasure enable signal ER is inputted to one of the input terminals of a third NAND gate ND3 and one of the input terminals of a fourth NAND gate ND4 through a first inverter I1, respectively. A bi-directional address signal ADD1b is inputted to a second inverter I2 and one of the input terminals of a second NOR gate NR2, respectively. An output signal of the second inverter I2 is inputted to one of the input terminals of a first NOR gate NR1. An output buffer control signal BHEb is inputted to the other input terminal of the first NOR gate NR1 and the other input terminal of the second NOR gate NR2, and the output signal of the first NOR gate NR1 and the output signal of the second NOR gate NR2 are inputted to one of the input terminal of at first NAND gate ND1 and one of the input terminal of a second NAND gate ND2, respectively. A sense amplifier enable signal SEb is inputted to the other input terminal of the first NAND gate ND1 and the other input terminal of the second NAND gate ND2 through a third inverter I3, and the output signal of the first NAND gate ND1 is inputted the other input terminal of the third NAND gate ND3. The output signal of the third NAND gate ND3 is inputted to a first output terminal SAG1 through a fourth inverter I4, and the output signal of the fourth NAND gate ND4 is inputted to a second output terminal SAG2 through a fifth inverter I5.

The operation of the circuit will be now explained as follows.

First, in the case where the erasure enable signal ER, the sense amplifier enable signal SEb and the output buffer control signal BHEb are inputted as a low level will be explained. In this case, when the bi-directional address signal ADD1b is inputted as a low level, the output of the second inverter I2 is at a high level. The output of the first NOR gate NR1 to which the output signal of the second inverter I2 and the output buffer control signal BHEb are inputted, respectively, is maintained at a low level. The sense amplifier enable signal SEb is inverted to a high level through the third inverter I3 and an output of the first NAND gate ND1 to which the output signal of the third inverter I3 and the output signal of the first NOR gate NR1 are inputted is maintained at a high level.

At this time, the erasure enable signal ER is inverted to a high level through the first inverter I1, the output of the third NAND gate ND3 to which the output signal of the first inverter I1 and the output signal of the first NAND gate ND1 are inputted is maintained at a low level. Also, the output of the third NAND gate ND3 is inverted to a high level through the fourth inverter I4 so that an output of the first output terminal SAG1 is maintained at a high level. Meanwhile, the output of the second NOR gate NR2 to which the bi-directional address signal ADD1b and the output buffer control signal BHEb are inputted, respectively, is maintained at a high state, and the output of the second NAND gate ND2 to which the output signals of the third inverter I3 and the second NOR gate NR2 are inputted, respectively, is maintained at a low level.

At this time, the output of the first inverter I1 is inverted to a high level, the output of the fourth NAND gate ND4 to which the output signals of the first inverter I1 and the second NAND gate ND2 are inputted, respectively, is maintained at a high level. And the output of the fourth NAND gate ND4 is inverted to a low level through the fifth inverter I5 so that the output of the second output terminal SAG2 is maintained at a low level.

In the state described above, if the bi-directional address signal ADD1b transits from a low level to a high level, the output of the second NAND gate ND2 transits from a low level to a low level, and the output of the first NAND gate ND1 transits from a high level to a low level, thus the output of the second output terminal SAG2 changes to a high level and the output of the first output terminal SAG1 changes to a low level.

Also, in case where the sense amplifier enable signal SEb and the output buffer control signal BHEb transit to a high level, the outputs of the first and the second output terminals SAG1 and SAG2 change to a high level.

That is, the first and second sense amplifier groups which are connected to the first and the second output terminals SAG1 and SAG2, respectively, are maintained at an idle state and an active state in response to the output levels of the first and the second output terminals SAG1 and SAG2.

For reference, although the embodiment of the present invention is described by example of two sense amplifier groups, it is possible to operate selectively a plurality of sense amplifier groups by constructing the above mentioned the circuit for controlling the sense amplifiers with a multistage.

As mentioned above, the circuit for controlling the sense amplifiers according to the present invention can operate a plurality of sense amplifier groups selectively by controlling the bi-directional address signal ADD1b for transferring data to the output buffer, the output buffer control signal BHEb for controlling the type of the data to be outputted into 8 byte, 16 byte etc., the sense amplifier enable signal SEb for enabling the sense amplifier, and the erasure enable signal ER. Therefore, the present invention can minimize a number of the sense amplifier groups, thereby reducing the power consumption and a implementing a low power device.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A circuit for controlling sense amplifiers comprising:
    an input means receiving an erase enable signal, a bi-directional address signal and a sense amplifier enable signal;
    a decoding means receiving an output buffer control signal, said bi-directional address signal and a first and a second output signals of said input means;
    a first output means receiving a third output signal of said input means and a first output signal of said decoding means;
    a first output terminal connected to an output terminal of said first output means;
    a second output means receiving said third output signal of said input means and a second output signal of said decoding means; and
    a second output terminal connected to an output terminal of said second output means.

2. A circuit for controlling sense amplifiers comprising:
    a first inverter to which an erasure enable signal is inputted;
    a second inverter to which a bi-directional address signal is inputted;
    a third inverter to which a sense amplifier enable signal is inputted;
    a first NOR gate to which an output signal of said second inverter and an output buffer control signal are inputted;
    a first NAND gate to which an output signal of said first NOR gate and an output signal of said third inverter are inputted;
    a third NAND gate to which an output signal of said first NAND gate and an output signal of said first inverter are inputted;
    a fourth inverter for inverting an output signal of said third NAND gate;
    a first output terminal for transferring an output signal of said fourth inverter to a first sense amplifier group;
    a second NOR gate to which said bi-directional address signal and said output buffer control signal are inputted;

a second NAND gate to which an output signal of said second NOR gate and an output signal of said third inverter are inputted;

a fourth NAND gate to which an output signal of said second NAND gate and said output signal of said first inverter are inputted;

a fifth inverter for inverting an output signal of said fourth NAND gate; and a second output terminal for transferring an output signal of said fifth inverter to a second sense amplifier group.

3. The circuit of claim 1, wherein said input means, comprising:

a first inverter to which said erase enable signal is inputted;

a second inverter to which said bi-directional address signal is inputted; and a third inverter to which said sense amplifier enable signal is inputted.

4. The circuit of claim 1, wherein said decoding means, comprising:

a first NOR gate to which said first output signal of said input means and said output buffer control signal are inputted;

a second NOR gate to which said output buffer control signal and said bi-directional address signal are inputted;

a first NAND gate to which an output signal of said first NOR gate and said second output signal of said input means are inputted; and a second NAND gate to which said second output signal of said input means and an output signal of said second NOR gate are inputted.

5. The circuit of claim 1, wherein said first output means, comprising:

a third NAND gate to which said third output signal of said input means and said first output signal of said decoding means are inputted; and a fourth inverter receiving an output signal of said third NAND gate and connected to said first output terminal through an output terminal.

6. The circuit of claim 1, wherein said second output means, comprising:

a fourth NAND gate to which said third output signal of said input means and second output signal of said decoding means are inputted; and a fifth inverter receiving an output signal of said fourth NAND gate and connected to said second output terminal through an output terminal.

7. A circuit for controlling sense amplifiers, by which some of sense amplifier groups are selectively operated, comprising:

an input means to which an erase enable signal, a bi-directional address signal for transferring data to an output buffer, and a sense amplifier enable signal are inputted;

a decoding means to which an output buffer control signal for controlling a type of data to be outputted into 8 byte or 16 byte, said bi-directional address signal and a first and a second output signals of said input means are inputted;

a first output means receiving a third output signal of said input means and a first output signal of said decoding means;

a first output terminal connected to an output terminal of said first output means;

a second output means receiving said third output signal of said input means and a second output signal of said decoding means; and a second output terminal connected to an output terminal of said second output means.

8. The circuit of claim 7, wherein said input means, comprising:

a first inverter to which said erase enable signal is inputted;

a second inverter to which said bi-directional address signal is inputted; and a third inverter to which said sense amplifier enable signal is inputted.

9. The circuit of claim 7, wherein said decoding means, comprising:

a first NOR gate to which said first output signal of said input means and said output buffer control signal are inputted;

a second NOR gate to which said output buffer control signal and said bi-directional address signal are inputted;

a first NAND gate to which an output signal of said first NOR gate and said second output signal of said input means are inputted; and a second NAND gate to which said second output signal of said input means and an output signal of said second NOR gate are inputted.

10. The circuit of claim 7, wherein said first output means, comprising:

a third NAND gate to which said third output signal of said input means and said first output signal of said decoding means are inputted; and a fourth inverter receiving an output signal of said third NAND gate and connected to said first output terminal through an output terminal.

11. The circuit of claim 7, wherein said second output means, comprising:

a fourth NAND gate to which said third output signal of said input means and said second output signal of said decoding means are inputted; and a fifth inverter receiving an output signal of said fourth NAND gate and connected to said second output terminal through an output terminal.

* * * * *